United States Patent [19]

Albon et al.

[11] Patent Number: 5,469,378
[45] Date of Patent: Nov. 21, 1995

[54] CONTENT ADDRESSABLE MEMORY HAVING MATCH LINE TRANSISTORS CONNECTED IN SERIES AND COUPLED TO CURRENT SENSING CIRCUIT

[75] Inventors: Richard Albon; Neil Hastie, both of Devon, United Kingdom

[73] Assignee: Plessey Semiconductors Limited, United Kingdom

[21] Appl. No.: 231,252

[22] Filed: Apr. 22, 1994

[30] Foreign Application Priority Data

Apr. 28, 1993 [GB] United Kingdom .................... 9308778

[51] Int. Cl.⁶ .................................................. G11C 15/04
[52] U.S. Cl. ................. 365/49; 365/189.07; 365/189.05; 365/230.08; 365/190
[58] Field of Search ............................... 365/49, 189.07, 365/189.05, 230.08, 190

[56] References Cited

U.S. PATENT DOCUMENTS 4,823,313  4/1989  Kadota ..................................... 365/49
4,930,104  5/1990  Nakagawa et al. ..................... 365/49
4,975,873  12/1990 Nakabayashi et al. ................. 365/49
5,130,947  7/1992  Reed ..................................... 365/227

OTHER PUBLICATIONS

IEEE Journal of Solid–State Circuits, vol. 27, No. 5, May, 1992, New York US pp. 737–744; Shin, et al;., "A Special Purpose Content Addressable Memory Chip For Real Time Image Processing".

Primary Examiner—David C. Nelms
Assistant Examiner—Andrew Q. Tran
Attorney, Agent, or Firm—Kirschstein et al.

[57] ABSTRACT

In a contents addressable memory for a fully associative cache memory in which address bit values in respect of data to be retrieved from cache are applied to the bit lines of respective columns of cells for comparison with the bit values held by the cells, a match in any one cell is arranged to forward bias a match line device in that cell, the match line devices of a row being connected in cascade, so that if a match is obtained along a row a current path is provided along the row to a respective current sensing circuit to indicate the match.

4 Claims, 2 Drawing Sheets

CONTENT ADDRESSABLE MEMORY HAVING MATCH LINE TRANSISTORS CONNECTED IN SERIES AND COUPLED TO CURRENT SENSING CIRCUIT

BACKGROUND OF THE INVENTION

The present invention relates to contents addressable memories. In particular although not exclusively the invention relates to contents addressable memories for use as fully associative cache memories.

Cache memories may be characterised by the number of cache locations into which a particular block of data may be placed. For example, if a block of data called up from main storage may be placed in any of four separate locations in a cache memory then the cache is said to be four way set associative. Caches may range from one way set associative, or direct-mapped caches, to fully associative, in which a block of dam may be placed in any location.

Each location in a cache memory comprises an address store location and an associated data store location. When a processor served by the cache memory issues a new address, the cache compares this address with any addresses it holds in its address store locations, and if the new address matches that held in one of the address store locations the data held in the associated store location is passed to the processor. In a direct mapped cache in which only one location can possibly hold the required data only one comparison is required. As the level of associativity increases so does the number of comparisons required, and since these comparisons must be done in parallel to meet the timing constraints imposed by the processor, this requires the use of a contents addressable memory.

SUMMARY OF THE INVENTION

According to one aspect of the present invention in a contents addressable memory comprising an array of memory cells arranged in rows and columns, each of a plurality of said memory cells includes a cascadable matchline device, and said matchline devices in respect of a row of said plurality of memory cells are arranged to be connected in a series path to an input of a current sensing circuit.

According to another aspect of the present invention in a contents addressable memory comprising a plurality of memory cells arranged in rows and columns, with a respective pair of data bit lines associated with each column of memory cells, each said memory cell includes a matchline transistor device and circuit means responsive in operation to a data bit value held by said memory cell and to a data bit value represented by signals on the respective pair of data bit lines selectively to bias said matchline transistor device into a conductive condition, and the matchline transistor devices of a row of memory cells are arranged to be connected in a series path to an input of a current sensing circuit.

BRIEF DESCRIPTION OF THE DRAWINGS

A contents addressable memory in accordance with the present invention will now be described by way of example with reference to the accompanying drawings, of which.

DETAILED DESCRIPTION OF THE PREFERRED EMBODIMENT

Figure 1:
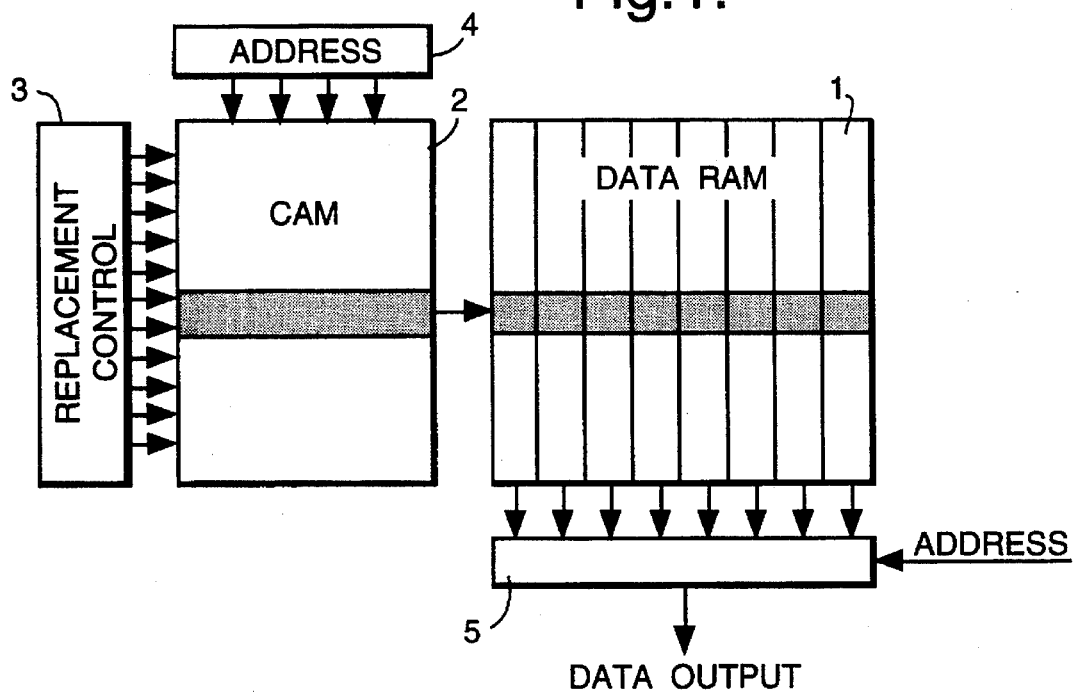
FIG. 1 shows schematically a cache memory arrangement utilising contents addressable memory.

Referring first to FIG. 1 a cache memory for a processor (not shown) comprises a random access memory (RAM) 1, in which is held data from a main storage area (not shown) which has been called up for use by the processor or which is required to be available to the processor for rapid access, together with a contents addressable memory 2 in which are held addresses, or tags, identifying and locating particular data words held in the random access memory 1. The addresses or tags may correspond to the main memory addresses of the respective data words.

The data words and their addresses may be entered in the cache memory in the sequence in which they are called up from main memory or, in known manner, in accordance with a replacement algorithm under the control of a replacement control unit 3.

When the processor issues an address for data which is to be called up, that address is entered in a register 4, whereupon it is compared with all the addresses held in the memory 2, and if a hit is obtained, the corresponding data word or words held in the data RAM 1 is or are read out by way of an output register 5. If no hit is obtained the required data has to be called up from main memory.

Figure 2:
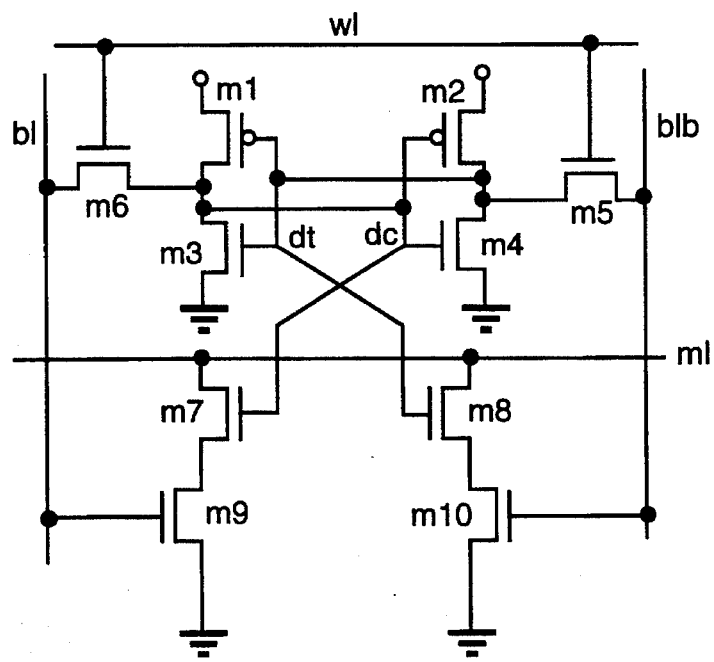
FIG. 2 shows diagrammatically a known form of contents addressable memory cell.

Referring now to FIG. 2, a known form of contents addressable memory cell comprises transistors m1 to m4 connected as a pair of cross-coupled inverters, which are connected to bit lines b1 and b1b by way of access transistors m6 and m5 respectively. These access transistors are arranged to be controlled by potentials applied to a word line w1. The bit lines b1 and b1b are common to a column of cells while the word line w1 is common to a row of cells. A match line m1 runs across the array of cells parallel to a word line w1, this match line being precharged to the supply voltage vdd at the beginning of a comparison cycle. The bit values of an address loaded into the register 4 are applied to respective ones of the bit lines b1 and b1b of the array of contents addressable memory cells so that each address bit value will be compared with the values stored in the associated column of cells. The address bit values are applied in such a sense that if at any cell a match occurs transistors m7 to m10 of that cell will be biased so that neither the pair of transistors m7, m9 nor the pair of transistors m8, m10 will provide a path to ground from the match line m1. If a match occurs at all cells along a row, then the match line m1 for that row will remain charged to vdd and a hit will be indicated. On the other hand, if at any cell along a row a mismatch occurs, either the transistors m7, m9 or the transistors m8, m10 will provide a path to ground for the respective match line and a miss will be indicated by the lowered potential on that match fine.

When the comparison is done at high speed and on many rows the result will be a large transient on the power supply rail, and even if the circuit is designed and toleranced to avoid device failure the power consumption resulting from the discharging of a large number of match lines can still be significant.

Figure 3:
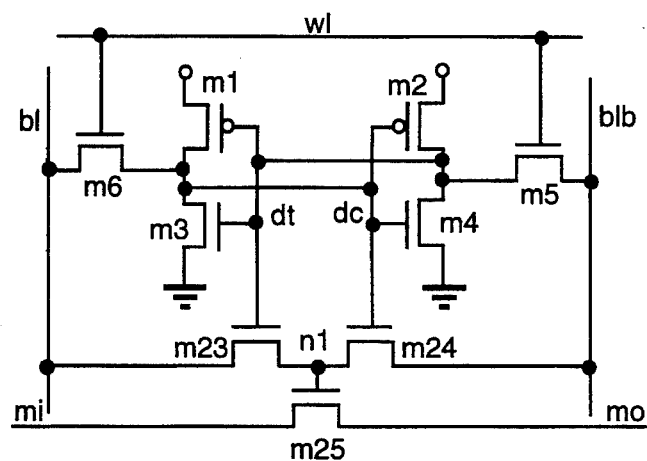
FIG. 3 shows diagrammatically a contents addressable memory cell in accordance with the present invention.
Figure 4:
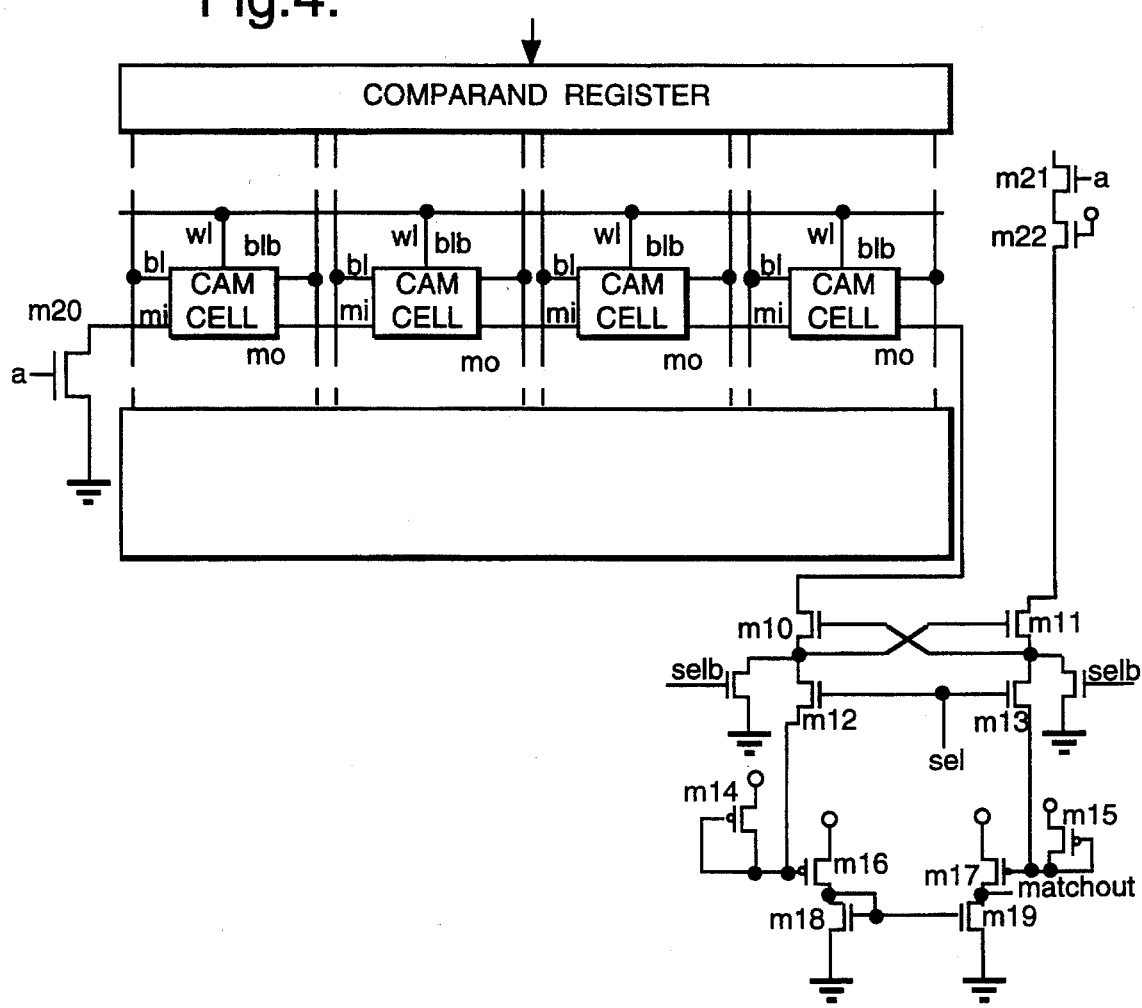
FIG. 4 shows schematically part of a contents addressable memory utilising the form of memory cell shown in FIG. 3.

Referring to FIGS. 3 and 4, in a contents addressable memory cell in accordance with the invention the transistors m7 to m10 of the known form of match line circuit are replaced by transistors m23 and m24 respectively connecting the bit lines b1 and b1b to a node n1 and a transistor m25 in series with the match line between mi and mo and with its gate electrode connected to the node n1. As shown in FIG. 4 the match lines of a row of cells are connected in series with one another and with a transistor m20 between ground and one input of a current sensing circuit comprising transistors m10 to m19.

At the beginning of an address comparison cycle the transistor 20 of each row of memory cells is biased into conduction so as to connect the match line input mi of the first memory cell in the row to ground. The last cell in the row has its match line output mo connected to the transistor m10 of the respective current sensing circuit. The current sensing circuit provides current paths to vdd through current mirror input devices m14 and m15 respectively from the match line and from a load path comprising transistors m21 and m22 when access transistors m12 and m13 are switched on by an access signal sel, the inverse of which, selb, is used to bring the intermediate nodes of the current transfer circuit m10 to m13 to ground potential before the start of the comparison cycle. The current mirror output currents through transistors m16 and m17 are applied to a single-ended current mirror output circuit comprising transistors m18 and m19 for converting the current difference between the match line current and the load path current into a voltage output signal on the matchout path.

Address bit values from the register 4 are applied to respective ones of the bit lines b1 and b1b in such a sense that if at any cell the bit value matches that held by the cell then the transistors m23 and m24 are biased such that the potential at the node n1 forward biases the transistor m25. In the form of cell shown in FIG. 3 the address bit values are applied inverted to the bit lines b1 and b1b during a comparison cycle, compared to the sense in which corresponding bit values are held in the memory cells, to simplify the physical layout of the cells on chip.

If matches occur all along a row then a conducting path is provided along the match line. The load path through transistors m21 and m22 is sized to provide a d.c. reference current of approximately half of the current which flows in a conducting match line, so that match and no-match conditions provide current differences to the current mirror output circuit that are approximately equal but in opposite senses.

Since in many applications only a single match occurs in a comparison cycle the total current consumed by the present circuit is significantly less than in the known circuit of FIG. 2. At the same time the ability of the current sensing circuit to detect currents on high capacitance match lines at high speed with no voltage excursion necessary makes the present circuit ideal for high performance cache memory arrangements. Since the transistors m25 are cascaded along the match line the voltage levels provided on the bit lines b1 and b1b to ensure that these transistors 25 are on or off as required can be significantly less than the vdd levels that are applied in known circuits. The absolute minimum high level needed on the bit lines in order for the potential at n1 to turn on m25 is approximately vdd/2. This means that the power consumed in driving the many high capacitance bit lines for a comparison cycle will be reduced by a factor of four.

We claim:

1. A contents addressable memory comprising a plurality of memory cells arranged in rows and columns, respective first and second bit lines associated with each column of said plurality of memory cells, means for applying address bit values to said respective bit lines, each memory cell comprising:

electric circuit means for storing a binary value as a potential difference between first and second nodes of said electric circuit means;

first, second and third transistors each having an input/output path and a control electrode for controlling current flow in said input/output path;

means connecting the control electrodes of said first and second transistors to said first and second nodes respectively; and means connecting the control electrode of said third transistor to said first and second bit lines by way of the input/output paths of said first and second transistors respectively, means connecting the input/output paths of the respective third transistors of the memory cells of a row in series to form a matchline path for said row, and current sensing means responsive to current flow in a said matchline path associated with any of said rows of memory cells to detect a match between the address bit values applied to said bit lines and the binary values stored in the respective electric circuit means of the memory cells of said row.

2. A contents addressable memory in accordance with claim 1 including an address register for holding said address bit values to be applied to said respective bit lines.

3. A contents addressable memory in accordance with claim 2 wherein said address bit values are applied to said bit lines such that if the address bit values held in said address register match the binary values stored in said row of memory cells, the respective third transistors of the memory cells of said row are all biased into a conductive state so that the matchline path for said row is in the conductive state.

4. A contents addressable memory in accordance with claim 1 wherein said current sensing means responsive to current flow in said matchline path is arranged to provide a voltage output signal to indicate said match.

* * * * *